(12) United States Patent
Aderhold

(10) Patent No.: US 12,366,481 B2
(45) Date of Patent: Jul. 22, 2025

(54) REFLECTOR PLATE FOR SUBSTRATE PROCESSING

(71) Applicant: Applied Materials, Inc., Santa Clara, CA (US)

(72) Inventor: Wolfgang R. Aderhold, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/519,913

(22) Filed: Nov. 27, 2023

(65) Prior Publication Data

US 2024/0175753 A1    May 30, 2024

Related U.S. Application Data

(63) Continuation of application No. 16/953,670, filed on Nov. 20, 2020, now Pat. No. 11,828,656.

(51) Int. Cl.
*G01J 5/00* (2022.01)
*G01J 5/0808* (2022.01)
(Continued)

(52) U.S. Cl.
CPC ........... *G01J 5/0007* (2013.01); *G01J 5/0808* (2022.01); *G02B 1/11* (2013.01); *G02B 5/09* (2013.01);
(Continued)

(58) Field of Classification Search
CPC ...... G01J 5/0007; G01J 5/0808; G01J 5/0813; G01J 5/0818; G02B 1/11; G02B 5/09;
(Continued)

(56) References Cited

U.S. PATENT DOCUMENTS 3,559,564 A    2/1971    Turner et al.
5,624,499 A *  4/1997    Mizuno ............. C23C 16/45521
                                                  118/728

(Continued)

FOREIGN PATENT DOCUMENTS

JP    2011023514 A    2/2011
KR    20030078677 A   10/2003
(Continued)

OTHER PUBLICATIONS

International Search Report and Written Opinion dated Feb. 28, 2022 for Application No. PCT/US2021/057654.

(Continued)

*Primary Examiner* — Sang Y Paik
(74) *Attorney, Agent, or Firm* — Patterson + Sheridan, LLP

(57) ABSTRACT

Embodiments of the present disclosure generally relate to apparatus for processing a substrate, and more specifically to reflector plates for rapid thermal processing. In an embodiment, a reflector plate assembly for processing a substrate is provided. The reflector plate assembly includes a reflector plate body, a plurality of sub-reflector plates disposed within the reflector plate body, and a plurality of pyrometers. A pyrometer of the plurality of pyrometers is coupled to an opening formed in a sub-reflector plate. Chambers including a reflector plate assembly are also described herein.

20 Claims, 3 Drawing Sheets

(51) Int. Cl.
  *G02B 1/11* (2015.01)
  *G02B 5/09* (2006.01)
  *H01L 21/67* (2006.01)
  *H05B 1/02* (2006.01)
  *H05B 3/00* (2006.01)
(52) U.S. Cl.
  CPC .. *H01L 21/67115* (2013.01); *H01L 21/67248* (2013.01); *H05B 1/0233* (2013.01); *H05B 3/0047* (2013.01); *H05B 2203/032* (2013.01)
(58) Field of Classification Search
  CPC ......... H01L 21/67103; H01L 21/67109; H01L 21/67115; H01L 21/67248; H01L 21/68742; H05B 1/0233; H05B 2203/032; H05B 3/0047
  USPC ....................................................... 219/444.1
  See application file for complete search history.

(56) References Cited

U.S. PATENT DOCUMENTS

| | | |
|---|---|---|
| 5,660,472 A | 8/1997 | Peuse et al. |
| 5,790,751 A | 8/1998 | Gronet et al. |
| 6,121,579 A * | 9/2000 | Aoki .................... C23C 16/481 |
| | | 219/390 |
| 6,280,183 B1 | 8/2001 | Mayur et al. |
| 9,449,858 B2 | 9/2016 | Koelmel et al. |
| 2003/0184696 A1 | 10/2003 | Shimanuki et al. |
| 2004/0079746 A1 | 4/2004 | Jennings et al. |
| 2004/0112885 A1 | 6/2004 | Shigeoka et al. |
| 2006/0066193 A1* | 3/2006 | Ranish ............. H01L 21/67115 |
| | | 313/116 |
| 2012/0070136 A1 | 3/2012 | Koelmel et al. |
| 2012/0244448 A1 | 9/2012 | Hallum et al. |
| 2013/0112680 A1 | 5/2013 | Moritz et al. |
| 2013/0206362 A1 | 8/2013 | Li et al. |
| 2015/0170934 A1 | 6/2015 | Aderhold |
| 2015/0340257 A1* | 11/2015 | Brillhart .......... H01L 21/67201 |
| | | 392/416 |
| 2017/0032865 A1 | 2/2017 | Ranish et al. |

FOREIGN PATENT DOCUMENTS

| | | |
|---|---|---|
| KR | 100650895 B1 | 11/2006 |
| KR | 20180049201 A | 5/2018 |
| WO | 2014204579 A1 | 12/2014 |

OTHER PUBLICATIONS

Korean Office Action dated Jan. 9, 2025 for Application No. 10-2023-7020380 in 14 pages.

* cited by examiner

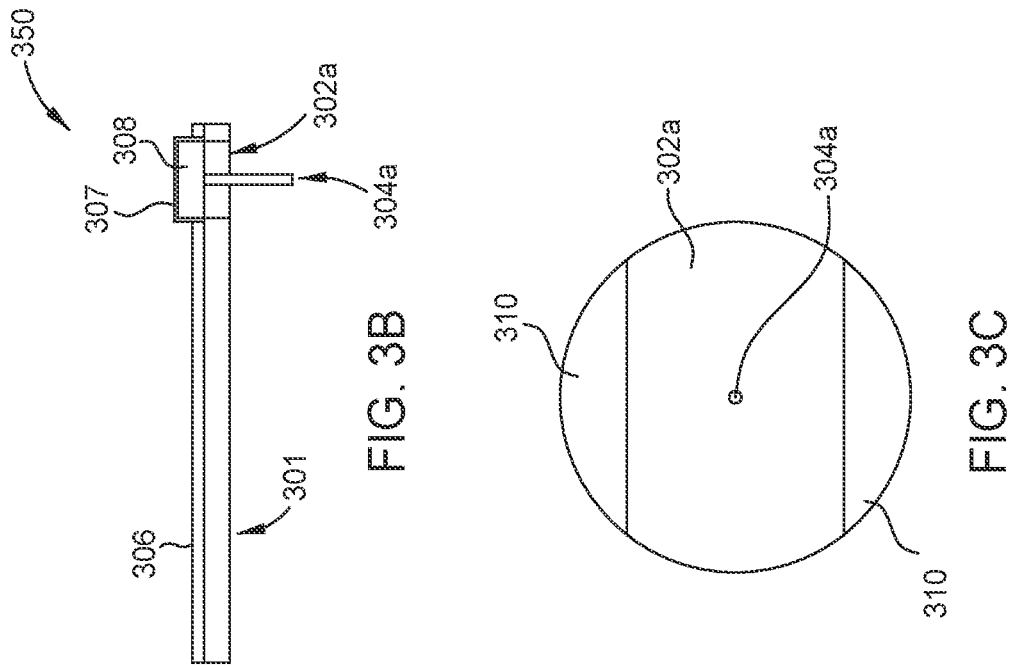
FIG. 3B
FIG. 3C
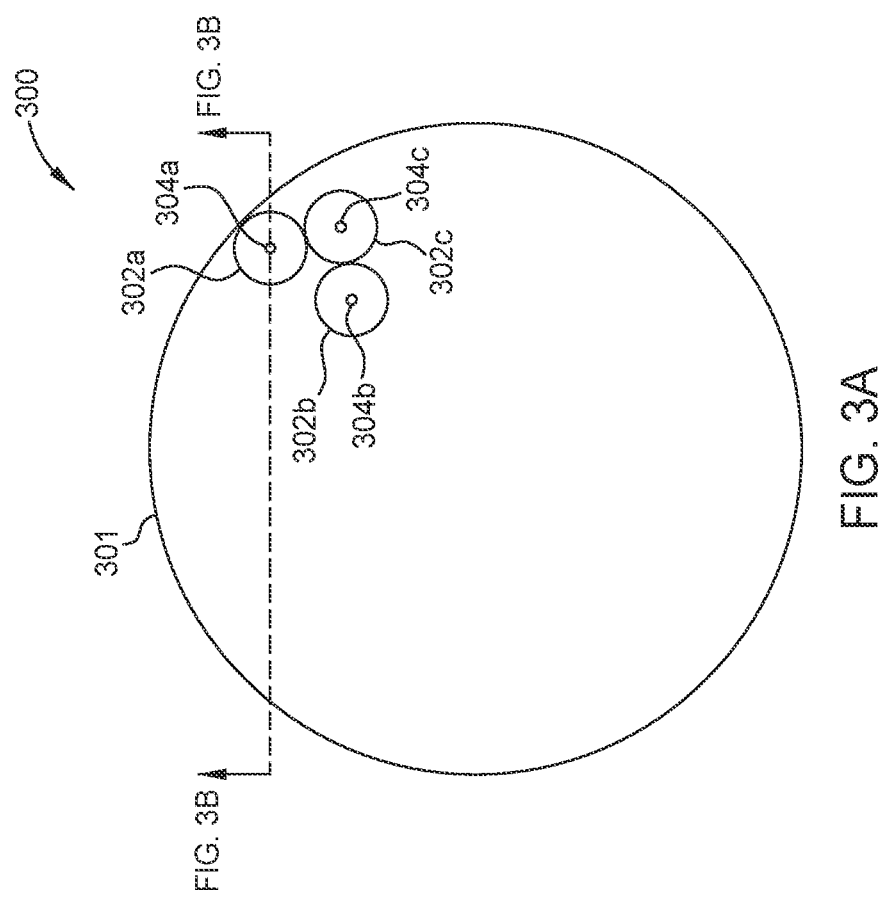
FIG. 3A

REFLECTOR PLATE FOR SUBSTRATE PROCESSING

CROSS-REFERENCE TO RELATED APPLICATIONS

This application is a continuation of U.S. patent application Ser. No. 16/953,670, filed Nov. 20, 2020. The aforementioned related patent application is herein incorporated by reference in its entirety.

BACKGROUND

Field

Embodiments of the present disclosure generally relate to apparatus for processing a substrate, and more specifically to reflector plates for rapid thermal processing.

Description of the Related Art

Rapid thermal processing (RTP) is a process for annealing substrates during semiconductor fabrication. During this process, thermal radiation is used to rapidly heat a substrate in a controlled environment to a maximum temperature of over nine hundred degrees above room temperature. Reflector plates used for RTP processing of a substrate utilize pyrometers for wafer temperature measurement. State-of-the-art reflector plates are manufactured to optimize 100% reflectivity in the pyrometer waveband even though only 10% or less of the reflector plate area is used for the pyrometers. Such a mismatch results in unnecessarily high costs. Moreover, for purposes such as energy savings and improved heating performance of the wafer, reflector plates should, e.g., reflect the whole bandwidth of wafer radiation at the entire wavelength surface. However, combining both energy savings and improved heating performance in one uniform reflector plate is costly as such a reflector plate requires, e.g., complex multi-layer coatings.

There is a need for new and improved reflector plates for substrate processing.

SUMMARY

Embodiments of the present disclosure generally relate to apparatus for processing a substrate, and more specifically to reflector plates for rapid thermal processing.

In an embodiment, a reflector plate assembly for processing a substrate is provided. The reflector plate assembly includes a reflector plate body, a plurality of sub-reflector plates disposed within the reflector plate body, and a plurality of pyrometers. A pyrometer of the plurality of pyrometers is coupled to an opening formed in a sub-reflector plate.

In another embodiment, a reflector plate assembly for processing a substrate is provided. The reflector plate assembly includes a reflector plate body, a plurality of sub-reflector plates disposed within the reflector plate body, and a plurality of pyrometers. A pyrometer of the plurality of pyrometers is coupled to an opening formed in a sub-reflector plate. A first cover is disposed over a portion of the reflector plate body, and a second cover is disposed over a portion of at least one sub-reflector plate, the second cover at a higher elevation than the first cover.

In another embodiment, a chamber for processing a substrate is provided. The chamber includes a chamber body, and a chamber lid disposed on the chamber body. The chamber lid includes a lid body and a reflector plate assembly. The reflector plate assembly includes a reflector plate body, a plurality of sub-reflector plates disposed within the reflector plate body, and a plurality of pyrometers, wherein a pyrometer of the plurality of pyrometers is coupled to an opening formed in a sub-reflector plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 3A is a top view of an example reflector plate assembly according to at least one embodiment of the present disclosure.

FIG. 3B is a cross-sectional view of the example reflector plate assembly shown in FIG. 3A according to at least one embodiment of the present disclosure.

FIG. 3C is an example sub-reflector plate having an anti-reflecting ring according to at least one embodiment of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to apparatus for processing a substrate, and more specifically to reflector plates for rapid thermal processing. Briefly, a plurality of sub-reflector plates are positioned within a base reflector plate. Each sub-reflector plate includes a pyrometer positioned therein to measure the temperature of a wafer at a plurality of locations across the wafer corresponding to zones of a substrate support on which the wafer is positioned. Additionally, or alternatively, each sub-reflector plate includes a pyrometer positioned therein to measure the temperature of a wafer at a plurality of locations across the wafer corresponding to zones in which lamps (which distribute radiant energy) are divided.

The reflector plates disclosed herein utilize sub-reflector plates embedded within a base reflector plate. The sub-reflector plates cover only a small portion of the entire base reflector plate, with each sub-reflector plate having a reflectivity optimized for the pyrometer wavelength of the pyrometer embedded therein. Integrating different sub-reflector plates into a base reflector plate body enables, e.g., independent functionality (e.g., temperature control, wavelength control) and independent optimization at each sub-reflector plate. By utilizing sub-reflector plates, the functionality of radiation enhancement can be enabled without affecting the reflection of the wafer radiation, which is provided by the base reflector plate. That is, the reflection of the base reflector plate can be adjusted without consideration of the pyrometer wavelength. Integrating different sub-reflector plates into a base reflector plate body also enables, e.g., cost-optimized manufacturing. Moreover, in contrast to conventional reflector plates that are made for a single purpose, the sub-reflector plates can be substituted for different sub-reflector plates, allowing for multi-purpose use.

Figure 1:
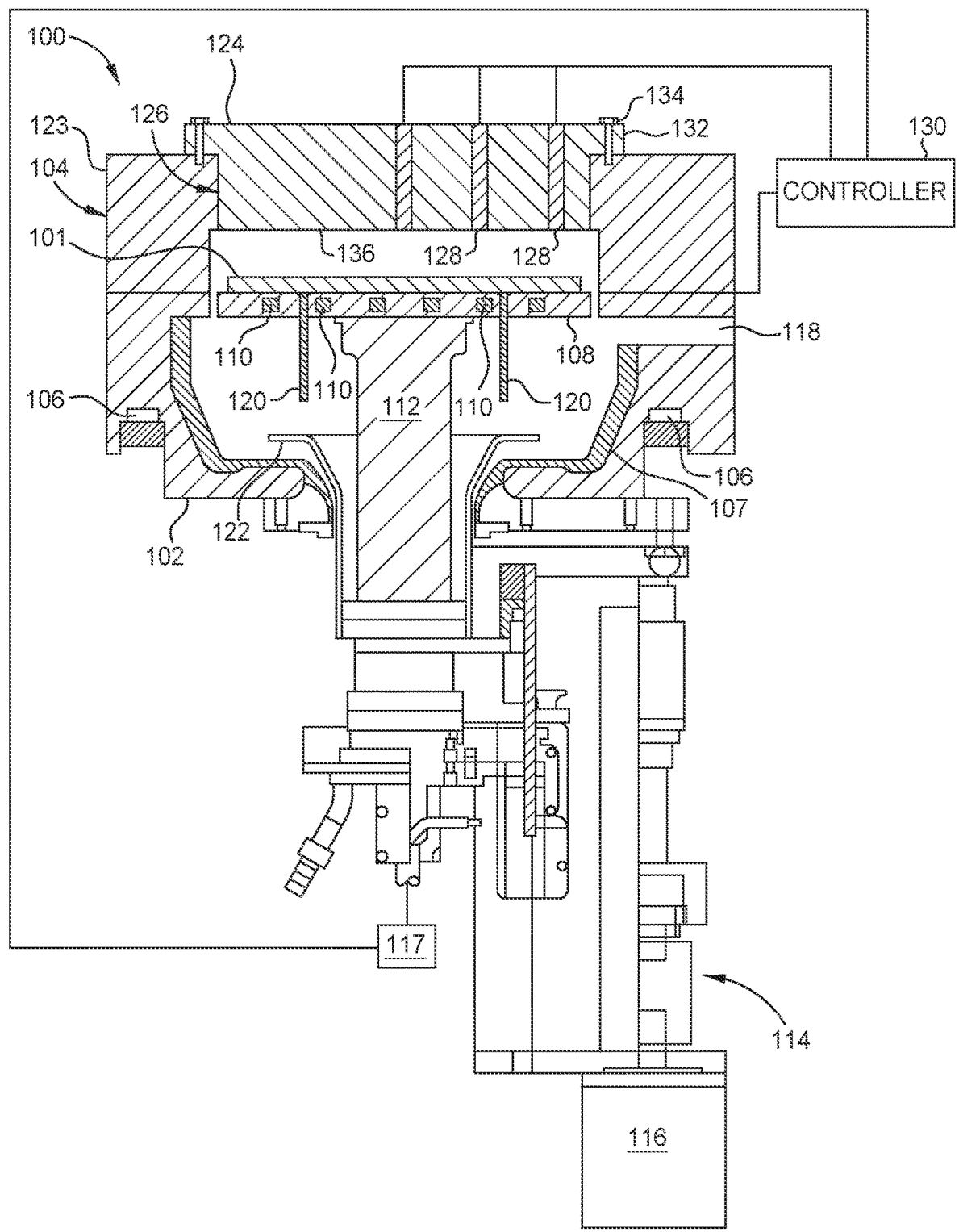
FIG. 1 is a sectional view of an example RTP chamber according to at least one embodiment of the present disclosure.

FIG. 1 is a sectional view of a RTP chamber 100 according to at least one embodiment of the present disclosure. The RTP chamber 100 is adapted to thermally process a substrate 101 positioned therein. The RTP chamber 100 includes a chamber body 102 and a chamber lid 104 disposed thereon. The chamber body 102 includes a fluid passage 106 formed therein to flow a temperature control fluid therethrough to cool the chamber body 102 during processing. Cooling of the chamber body 102 reduces the probability of degradation of the chamber body 102 due to thermal stresses during heating of the substrate 101. A liner 107, formed from a thermally insulating material such as aluminum nitride, is disposed around the interior surface of the chamber body 102 to facilitate heat containment within the chamber body and to increase thermal processing efficiency.

A substrate support 108 is positioned within the chamber body 102. The substrate support 108 can be formed from, e.g., sintered aluminum nitride. The substrate support 108 includes a plurality of heating elements 110, such as resistive heating elements embedded therein, to facilitate heating of the substrate 101 during processing. The heating elements 110 are coupled to a power source 117 by wires disposed through a support shaft 112. The heating elements 110 provide for heating of the substrate 101 via conduction, and can heat the substrate 101 to a temperature of about 20° C. to about 1000° C., such as from about 25° C. to about 500° C. Additionally, or alternatively, other types of heating such as radiation from lamp bulbs can be installed to provide heat to a substrate.

The support shaft 112 is coupled to the underside of the substrate support 108 and supports the substrate support 108. The support shaft 112 is coupled to a lifter assembly 114 which includes an actuator 116, such as a stepper motor, to facilitate positioning of the substrate 101 in a processing position adjacent the chamber lid 104. The lifter assembly 114 also facilitates removal of the substrate 101 from the chamber body 102 through an opening 118 (e.g., a slit valve). The lifter assembly 114 is adapted to actuate the substrate support 108 in a vertical direction to allow lift pins 120 to contact a lift plate 122 positioned within the chamber body 102. Contact of the lift pins 120 with the lift plate 122 lifts the substrate 101 from the surface of the substrate support 108 as the substrate support 108 is lowered. The substrate 101 is maintained on the lift pins 120 at a position which allows for removal of the substrate 101 from the chamber body 102 through the opening 118 by a robot (not shown).

The chamber lid 104 is positioned on the chamber body 102. The chamber lid 104 includes a lid body 123 and a reflector plate 124. The reflector plate 124 has a circular shape and is disposed within a circular opening 126 located within the lid body 123. The reflector plate 124 has an annular lip 132 having a diameter greater than the circular opening 126 to support the reflector plate 124 on the top surface of the lid body 123. The annular lip has a plurality of openings therethrough to accommodate fasteners 134, such as bolts, to secure the reflector plate 124 to the lid body 123. The reflector plate 124 is positioned within and extends through the circular opening 126. A surface 136 of the reflector plate 124 is positioned adjacent the substrate 101. Pyrometers 128 are disposed through the reflector plate 124 to measure the temperature of the substrate 101. Generally, one pyrometer 128 is adapted to measure the temperature of the substrate 101 corresponding to a zone of the substrate support 108 having an individual heating element 110 therein (only three pyrometers are illustrated in FIG. 1). It is contemplated, however, that each zone of the substrate support 108 may have more than one corresponding pyrometer for increased temperature monitoring. Each pyrometer 128 is coupled with a controller 130, which is likewise coupled with the power source 117. The controller 130 facilitates closed loop control of each zone of the substrate support 108 by controlling the power applied to each of the heating elements 110 by the power source 117.

Figure 2:
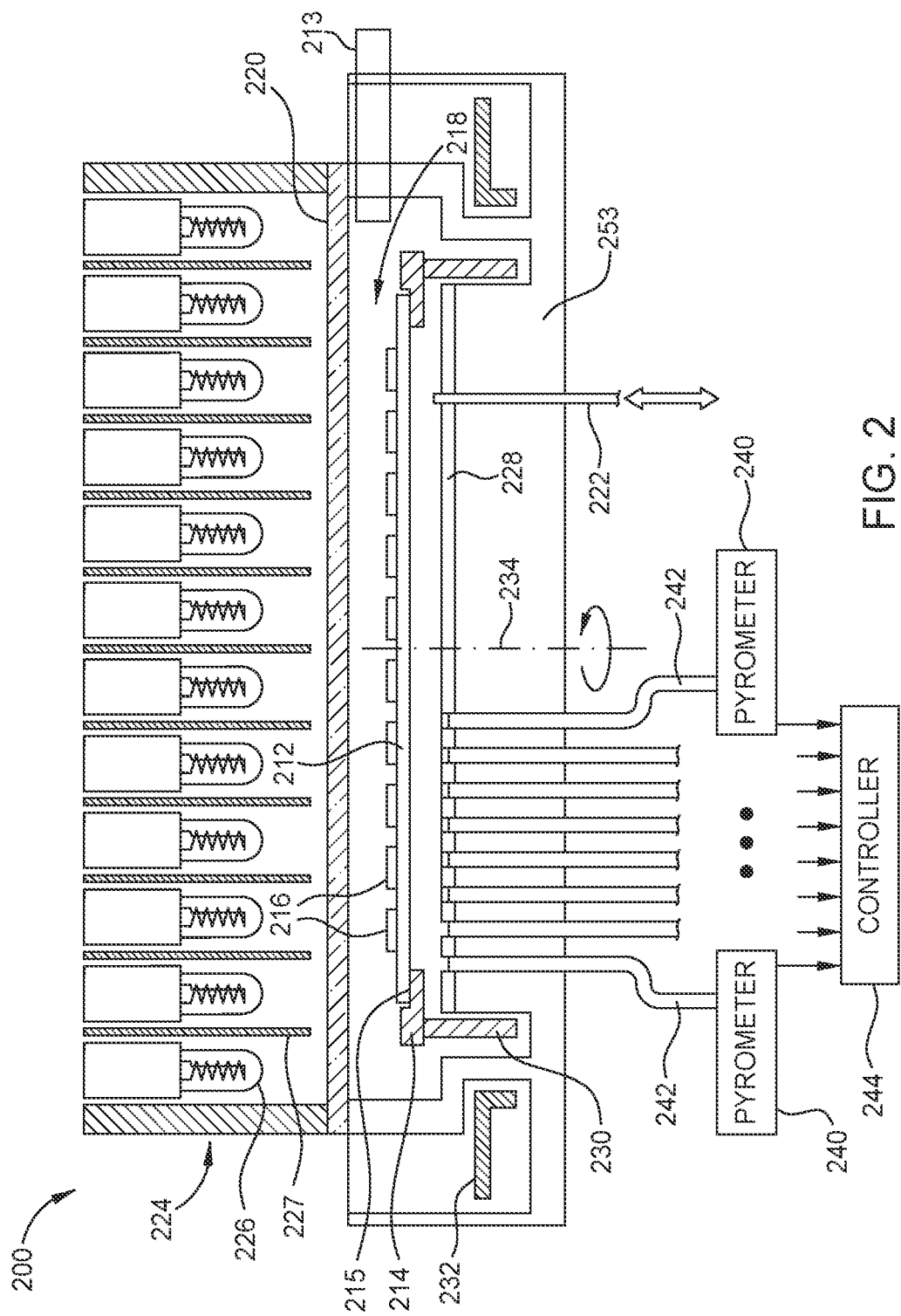
FIG. 2 is a sectional view of an example RTP chamber according to at least one embodiment of the present disclosure.

FIG. 2 schematically represents a RTP chamber 200 according to at least one embodiment of the present disclosure. A substrate or wafer 212, for example, a semiconductor wafer such as a silicon wafer to be thermally processed is passed through a valve or access port 213 into the process area 218 of the RTP chamber 200. The wafer 212 is supported on its periphery by a substrate support shown in this embodiment as an edge ring 214, which may have an annular sloping shelf 215 contacting the corner of the wafer 212. The wafer is oriented such that processed features 216 already formed in a front surface of the wafer 212 face upwardly, referenced to the downward gravitational field, toward a process area 218 defined on its upper side by a transparent quartz window 220. The transparent quartz window 220 can be located a distance from the wafer 212 such that the transparent quartz window 220 has minimal effect on cooling of the substrate during processing. Typically, the distance between the wafer 212 and the transparent quartz window 220 is on the order of 20 mm. Contrary to the schematic illustration, the features 216 for the most part do not project substantial distances beyond the surface of the wafer 212 but constitute patterning within and near the plane of the surface. Lift pins 222 may be raised and lowered to support the back side of the wafer 212 when the wafer is handed between a paddle or robot blade (not shown) bringing the wafer into the RTP chamber 200 and onto the edge ring 214. A radiant heating apparatus 224 is positioned above the transparent quartz window 220 to direct radiant energy toward the wafer 212 and to heat the wafer. In the RTP chamber 200, the radiant heating apparatus includes a large number, enough to provide uniform radiation to the substrate heated in the chamber, about 409 being an exemplary number, of lamps 226 positioned in respective reflective tubes 227 arranged in a hexagonal close-packed array above the transparent quartz window 220. In some embodiments, the lamps 226 are high-intensity tungsten-halogen lamps.

It is desirable to control the temperature across the wafer 212 to a closely defined temperature uniform across the wafer 212. In this regard, a reflector plate 228 extends parallel to and over an area greater than the wafer 212 and faces the back side of the wafer 212. The reflector plate 228 efficiently reflects heat radiation emitted from the wafer 212 back toward the wafer 212. In some embodiments, the spacing between the wafer 212 and the reflector plate 228 is about 3 mm to about 9 mm, and the aspect ratio of the width to the thickness of the cavity is greater than about 20. The reflector plate 228 can be supported on a water-cooled base 253 made of metal to heat sink excess radiation from the wafer 212, especially during cool down. The process area 218 of the processing chamber has at least two substantially parallel walls, of which a first is the transparent quartz window 220, made of a material being transparent to radiation such as quartz, and a second wall/base 253 substantially parallel to the first wall which is made of metal and is significantly not transparent. In some embodiments, the second wall and base is the reflector plate 228. The edge ring 214 is supported on a rotatable cylinder 230 that is magnetically coupled to a rotatable flange 232 positioned outside the chamber. A rotor (not shown) rotates the rotatable flange 232 and hence rotates the wafer about its central axis 234, which is also the centerline of the generally symmetric chamber.

The lamps 226 are divided into zones arranged generally ring-like about the central axis 234. Control circuitry varies the voltage delivered to the lamps 226 in the different zones to tailor the radial distribution of radiant energy. Dynamic control of the zoned heating can be caused by one or more of a plurality of pyrometers 240 coupled through one or more optical light pipes 242 positioned to face the back side of the wafer 212 through apertures in the reflector plate 228 to measure the temperature across a radius of the rotating wafer 212. The pyrometer 240 is disposed through the reflector plate 228.

The optical light pipes 242 can be formed of various structures including sapphire, metal, and silica fiber. A computerized controller 244 receives the outputs of the pyrometers 240 and controls the voltages supplied to the different rings of lamps 226 to dynamically control the radiant heating intensity and pattern during the processing. Pyrometers 240 generally measure light intensity in a narrow wavelength bandwidth of, e.g., about 40 nm in a range of, e.g., about 700 nm to about 4000 nm. The controller 244 or other instrumentation converts the light intensity to a temperature through the Planck distribution of the spectral distribution of light intensity radiating from a black-body held at that temperature.

The array of lamps 226 is sometimes referred to as the lamphead. However, other radiant heating apparatus may be substituted. Generally, these involve resistive heating to quickly ramp up the temperature of the radiant source. Examples of suitable lamps include mercury vapor lamps having an envelope of glass or silica surrounding a filament and flash lamps which comprise an envelope of glass or silica surrounding a gas such as xenon, which provides a heat source when the gas is energized. As used herein, the term lamp is intended to cover lamps including an envelope that surrounds a heat source. The "heat source" of a lamp refers to a material or element that can increase the temperature of the substrate, for example, a filament or gas that can be energized.

The chamber shown in FIG. 2 enables the edge ring 214 to be levitated at different vertical positions inside the RTP chamber 200 to permit control of the wafer's thermal exposure. It will be understood that the configuration shown in FIG. 2 is not intended to be limiting. For example, the present disclosure is not limited to configurations in which the heat source or lamps are directed at one side or surface of the substrate and the pyrometers are directed at the opposite side of the wafer.

Certain processing chambers, such as the RTP Centura™ or the RTP Centura XE™, manufactured by Applied Materials, Inc. of Santa Clara, California, can be used with the reflector plate assembly described herein. Alternatively, RTP chambers from other manufacturers can be used with the reflector plate assembly described herein.

Example Reflector Plate Assembly

FIG. 3A shows a top view of an example reflector plate assembly 300 according to at least one embodiment of the present disclosure. FIG. 3B shows a cross-sectional view of the reflector plate assembly 300 shown in FIG. 3A, as indicated by 350, according to at least one embodiment of the present disclosure. Reflector plate assembly 300 is utilized as a reflector plate (e.g., substituted for reflector plate 124 of FIG. 1 or reflector plate 228 of FIG. 2) with RTP chamber 100 or RTP chamber 200. Generally, the reflector plate assembly 300 described herein has multiple functions such as a high reflectivity at a pyrometer wavelength/wavelength range, a high reflectivity for the wafer radiation spectrum, and a reflectivity consistency around the pyrometer embedded in each sub-reflector plate of the reflector plate assembly 300. Moreover, the reflector plate assembly 300 described herein shields the process space from contaminants, e.g., metals, and minimizes cross-talk between the pyrometers.

The reflector plate assembly 300 includes a base reflector plate body 301. A plurality of sub-reflector plates 302 are embedded within the base reflector plate body 301. A pyrometer 304 is disposed through an opening of each sub-reflector plate 302. Although three sub-reflector plates 302a, 302b, and 302c are shown, more or less sub-reflector plates can be utilized. Similarly, although three pyrometers 304a, 304b, and 304c are shown, more or less pyrometers can be utilized. Simple methods for cutting out portions of the base reflector plate body 301 and inserting sub-reflector plates 202 can be performed in order to replace sub-reflector plates for, e.g., different substrate processes. For example, holes can be drilled in the base reflector plate body 301, and sub-reflector plates can be inserted into the holes with O-rings for sealing.

Referring to FIG. 3B, a cover 306 is disposed over the base reflector plate body 301, and a cover 307 is disposed over one or more the sub-reflector plates 302. Covers are used for, e.g., increasing the accuracy of pyrometers 304 which are disposed through sub-reflector plates 302 to measure the temperature, prevent outgassing of materials that make up base reflector plate body 301 and sub-reflector plates 302. Covers 306, 307 can be the same or different, and different sub-reflector plates 302 can have the same or different cover. Illustrative, but non-limiting examples of covers 306, 307 include, e.g., quartz, gold, silver, nickel, aluminum, rhodium, and combinations thereof. Additionally, or alternatively, the base reflector plate body 301, one or more the sub-reflector plates 302, or a combination thereof can be formed from, e.g., quartz, gold, silver, nickel, aluminum, rhodium, or combinations thereof. The sub-reflector plates 302 can be sealed separately from the base reflector plate body 301. Conventional reflector plates have the entire plate coated with quartz or other material. In contrast, the embodiments described herein exhibit differential/selective covers 306, 307. Such differential/selective covers of the sub-reflector plate or a smaller region around the pyrometer, as described herein, further reduces costs. The cover, e.g., helps prevent outgassing to the wafer surface, allowing metal plating (e.g., gold-plating, nickel-plating, etc.) of various parts of the reflector plate assembly 300.

The base reflector plate body 301, one or more sub-reflector plates 302, or combinations thereof, can be made from a ceramic, including but not limited alumina, bare aluminum, silicon carbide, quartz, sapphire. The ceramic can be optically transparent depending on the selected embodiment. In some embodiments, the base reflector plate body 301, one or more sub-reflector plates 302, or combinations thereof, is aluminum and includes a gold coating, nickel coating, or multi-layer dielectric interference mirror, which effectively forms a black-body cavity at the back of the wafer that tends to distribute heat from warmer portions of the wafer to cooler portions. In other embodiments, base reflector plate body 301, one or more sub-reflector plates 302, or combinations thereof, may have a more irregular surface or have a black or other colored surface. The base reflector plate body 301 can function to provide reflection in the infrared range.

FIG. 3B shows a sectioned cover 307 that can be made of or include, e.g., a transparent/semi-transparent material. Additionally, or alternatively, the cover 307 can be made of, or include, a heat resistant and/or non-reactive (inert) material, such as silica, quartz, or sapphire. The cover 307 is disposed at a desired height above the sub-reflector plate 302a, e.g., about 1 mm or more, such as from about 2 mm to about 10 mm, such as from about 4 mm to about 8 mm, due to, e.g., a cup 308 or plate, such as a quartz cup. As such, the cover 307 above sub-reflector plate 302a is at a higher elevation than the cover 306 disposed above the base reflector plate body 301. The cup 308 is sealed and within the cup is, e.g., atmosphere. The cup 308 it can be purged with gas, and/or O-ring sealed to provide a barrier for outgassing from the reflector to the process volume.

The higher elevation of cover 307 relative to cover 306 enables, e.g., differential temperatures above the base reflector plate body 301 and the sub-reflector plates 302. For example, the cover 307 can be heated to a higher temperature than the cover 306 above the base reflector plate body 301 to prevent condensation of outgassing materials from the wafers that can cloud the radiation of the pyrometer 304. The higher elevation also, e.g., enables reduced incidence of heating other surfaces that are near or even touching the base reflector plate body 301. For example, when an edge ring is utilized in a chamber (e.g., edge ring 214), the edge ring contacts the corner of the wafer being processed. Heat from conventional reflector plates can heat the edge ring. In contrast, and as shown in in FIG. 3B, a relatively lower base reflector plate body 301, and thus lower elevation of the cover 306, will reduce heat transfer to the edge ring. The sectioned covers can be sealed separately (with e.g., an O-ring) to prevent outgassing of contaminants to the process atmosphere. Additionally, or alternatively, a differential purging/pumping device can be coupled to holes for the pyrometer for evacuating contaminants.

With reference to the chamber of FIG. 1 and the reflector plate assembly 300 of FIG. 3A, each pyrometer 304 is adapted to measure the temperature of the substrate corresponding to a zone of the substrate support 108 having an individual heating element 110 therein. Each pyrometer 304 can be coupled with a controller (e.g., controller 130), which is likewise coupled with a power source (e.g., power source 117). The controller 130 facilitates closed loop control of each zone of the substrate support 108 by controlling the power applied to each of the heating elements 110 by the power source 117.

With reference to the chamber of FIG. 2 and the reflector plate assembly 300 of FIG. 3, each pyrometer 304 is adapted to measure the temperature of the substrate corresponding to the zones in which the lamps 226 are divided. In these embodiments, each sub-reflector 302 can have an opening where the light pipe is mounted. The temperature of each zone is adjusted in response to the signals from the plurality of pyrometers. Each pyrometer 304 can be coupled with a controller (e.g., controller 244), which is likewise coupled with a power source (not shown). The controller 244 receives the outputs of the pyrometers 240 and controls the voltages supplied to the different rings of lamps 226 to dynamically control the radiant heating intensity and pattern during the processing.

In some embodiments, the sub-reflector plates 302 are made to improve the reflectivity for the pyrometer 304 wavelength embedded therein. For example, the sub-reflector plates 302 can be sized to fill only the effective angle used to control the, e.g., adjacent lamp zone or substrate support zone. Such a size (in diameter) can be from about 10 mm to about 30 mm, such as from about 15 mm to about 25 mm.

In addition, the sub-reflector plates 302 can be small enough to minimize cross-talk between near or adjacent zones as radiation from outside the effective angle is reduced or eliminated by the size of the sub-reflector plate and a ring of low reflectivity around the outer edge of the sub-reflector plate.

In at least one embodiment, one or more of the sub-reflector plates 302 have a reflectance of about 0.5 or greater, such as about 0.9 or greater, such as about 0.95 or greater, such as about 0.96 or more, such as about 0.97 or more, such as about 0.98 or more, such as about 0.99 or more. In some embodiments, the one or more of the sub-reflector plates 302 have a reflectance close to the wavelength range of the pyrometer (e.g., about 1). One or more of the sub-reflector plates has a high reflectivity (e.g., about 0.9 or less) for radiation in a target wavelength range of the pyrometer embedded therein, a low reflectivity (e.g., about 0.5 or less) for radiation outside the target wavelength range of the pyrometer embedded therein, or a combination thereof.

In some embodiments, the base reflector plate body 301 has a reflectance of about 0.95 or more, such as about 0.96 or more, such as about 0.97 or more, such as about 0.98 or more.

The base reflector plate body 301 can generally have a diameter about equal to or slightly larger than that of the substrate support such as about 1% larger or more. Each individual sub-reflector plate 302 can have an area, relative to the area of the base reflector plate body 301, of about 3% or less, such as about 2% or less, such as about 1% or less, for example between about 0.5% and about 3%, such as from about 1% to about 2%, such as from about 1% to about 1.5%. In some embodiments, the total collective area of the sub-reflector plates 302, relative to the base reflector plate body 301, can be about 15% or less, such as about 10% or less, such as from about 1% to about 10%, such as from about 2% to about 8%, such as from about 4% to about 6% or about 5% to about 10%.

The base reflector plate body 301, one or more sub-reflector plates 302, or combinations thereof can be reflective of radiation having a wavelength/wavelength range from about 700 nm to about 4000 nm, such as from about 700 nm to about 1000 nm. In some embodiments, the reflectivity is close to unity for radiation in that target range, such as less than about 2, less than about 1, or less than about 0.3 for wavelengths below the target wavelength range, and is less than about 2, less than about 1, or less than about 0.3 for radiation having wavelength between 1200 nanometers and 10 μm. Other levels of reflection and absorption across the spectrum of radiation wavelength may also be utilized, e.g., reflectivity in the wavelength range from about 1000 nm to about 1200 nm, the range from about 1200 nm to about 2100 nm, and the range from about 2100 nm to about 2400 nm.

In some embodiments, at least one sub-reflector plate is external to at least one sub-reflector plate. In some embodiments, at least one sub-reflector plate shares a common tangent with at least one other sub-reflector.

FIG. 3C shows an example sub-reflector plate 302*a* having an anti-reflecting ring 310 according to at least one embodiment of the present disclosure. The anti-reflecting ring 310 can be a full or partial anti-reflecting ring, covering various dimensions of the sub-reflector plate 302*a*. As shown, the anti-reflecting ring 310 can be disposed above and/or around one or more sub-reflector plates. For reference, a pyrometer hole with lightpipe is shown as 304*a*. The anti-reflecting ring 310 can be used to reduce radiation from neighboring control zones and/or reduce or eliminate crosstalk between control zones. Instead of a ring, anti-reflective crescent segment(s), or other suitable shapes can be used.

As described herein, a reflector plate body is optimized for high reflectivity of wafer (or substrate) radiation. A plurality of sub-reflector plates within the reflector plate body has enhanced reflectivity for the pyrometer wavelength(s), large enough to fill the effective angle used to control the adjacent lamp group (or heating element), but small enough to minimize cross-talk from adjacent temperature control zones. A plurality of pyrometers are utilized to measure the substrate temperature. Specifically, each pyrometer measures the intensity of radiation emitted by the substrate. The reflector plate assembly described herein is tailored to this pyrometry system. The determination of the temperature from the intensity of radiation emitted by the substrate uses sub-reflector plates in the area around the pyrometers having high reflectivity with respect to radiation in the target wavelength/wavelength range of radiation, e.g., the wavelength range of radiation emitted by the substrate when the substrate is within the target temperature range. The surface of the sub-reflector plates, therefore, is highly reflective of radiation in the target temperature range.

As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including." Likewise whenever a composition, an element or a group of elements is preceded with the transitional phrase "comprising," it is understood that we also contemplate the same composition or group of elements with transitional phrases "consisting essentially of," "consisting of," "selected from the group of consisting of," or "is" preceding the recitation of the composition, element, or elements and vice versa.

For the purposes of this disclosure, and unless otherwise specified, all numerical values within the detailed description and the claims herein are modified by "about" or "approximately" the indicated value, and consider experimental error and variations that would be expected by a person having ordinary skill in the art.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

As used herein, the indefinite article "a" or "an" shall mean "at least one" unless specified to the contrary or the context clearly indicates otherwise. For example, embodiments comprising "a sub-reflector plate" include embodiments comprising one, two, or more sub-reflector plates, unless specified to the contrary or the context clearly indicates only one sub-reflector plate is included.

While the foregoing is directed to embodiments of the present disclosure, other and further embodiments of the disclosure may be devised without departing from the basic scope thereof, and the scope thereof is determined by the claims that follow.

What is claimed is:

1. A reflector plate assembly for processing a substrate, comprising:
   a base reflector plate having a plurality of sub-reflector plates embedded therein; and
   a sectioned cover comprising a first cover and a second cover, wherein the first cover is disposed over a first portion of the base reflector plate, and the second cover comprises a plurality of raised sections, the raised sections extending from the first cover and covering the plurality of sub-reflector plates.

2. The reflector plate assembly of claim 1, wherein the plurality of sub-reflector plates are composed of a different material than the base reflector plate.

3. The reflector plate assembly of claim 1, wherein the sectioned cover is composed of a transparent material.

4. The reflector plate assembly of claim 1, wherein the sectioned cover is composed of fused quartz.

5. The reflector plate assembly of claim 1, wherein the plurality of sub-reflector plates comprises a first sub-reflector plate disposed external to a second sub-reflector plate.

6. The reflector plate assembly of claim 1, wherein the plurality of sub-reflector plates comprises a first sub-reflector plate that shares a common tangent with a second sub-reflector plate.

7. The reflector plate assembly of claim 1, wherein the plurality of sub-reflector plates comprises a first sub-reflector plate that shares a common tangent with a second sub-reflector, and the first sub-reflector plate is disposed external to the second sub-reflector plate.

8. The reflector plate assembly of claim 1, wherein each sub-reflector plate of the plurality of sub-reflector plates has a high reflectivity for radiation in a target wavelength range of a pyrometer embedded therein, and a low reflectivity for radiation outside the target wavelength range of the pyrometer embedded therein.

9. The reflector plate assembly of claim 8, wherein:
   the high reflectivity is reflectivity of about 0.95 or more;
   the low reflectivity is reflectivity of about 0.5 or less; or
   a combination thereof.

10. The reflector plate assembly of claim 8, wherein the target wavelength range is from about 700 nm to about 1000 nm.

11. A reflector plate assembly for processing a substrate, comprising:
    a base reflector plate body having a plurality of sub-reflector plates embedded therein; and
    a sectioned cover comprising a first cover and a second cover, wherein the first cover is disposed over the base reflector plate body, and the second cover is disposed over a portion of at least one sub-reflector plate, the second cover being separate from the first cover, the second cover extending to a higher elevation than the first cover.

12. The reflector plate assembly of claim 11, wherein the plurality of sub-reflector plates are composed of a different material than the base reflector plate.

13. The reflector plate assembly of claim 11, wherein the sectioned cover is composed of a transparent material.

14. The reflector plate assembly of claim 11, wherein the sectioned cover is composed of fused quartz.

15. The reflector plate assembly of claim 11, wherein the plurality of sub-reflector plates comprise a first sub-reflector plate disposed external to a second sub-reflector plate.

16. The reflector plate assembly of claim 11, wherein the plurality of sub-reflector plates comprise a first sub-reflector plate that shares a common tangent with a second sub-reflector plate.

17. The reflector plate assembly of claim 11, wherein the plurality of sub-reflector plates comprise a first sub-reflector plate that shares a common tangent with a second sub-reflector, and the first sub-reflector plate disposed external to the second sub-reflector.

18. The reflector plate assembly of claim 11, wherein each sub-reflector plate of the plurality of sub-reflector plates has a high reflectivity for radiation in a target wavelength range of a pyrometer embedded therein, and a low reflectivity for radiation outside the target wavelength range of the pyrometer embedded therein.

19. The reflector plate assembly of claim 18, wherein:
the high reflectivity is reflectivity of about 0.95 or more;
the low reflectivity is reflectivity of about 0.5 or less; or
a combination thereof.

20. The reflector plate assembly of claim 18, wherein the target wavelength range is from about 700 nm to about 1000 nm.

\* \* \* \* \*